(12) United States Patent
Jung

(10) Patent No.: US 7,110,293 B2
(45) Date of Patent: Sep. 19, 2006

(54) NON-VOLATILE MEMORY ELEMENT WITH OXIDE STACK AND NON-VOLATILE SRAM USING THE SAME

(75) Inventor: Jin Hyo Jung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/022,621

(22) Filed: Dec. 27, 2004

(65) Prior Publication Data

US 2005/0162896 A1    Jul. 28, 2005

(30) Foreign Application Priority Data

Dec. 26, 2003   (KR) .................... 10-2003-0097916

(51) Int. Cl.
   *G11C 11/34*    (2006.01)
(52) U.S. Cl. .................... 365/185.08; 365/185.24; 365/185.07; 365/154
(58) Field of Classification Search ............... 365/154, 365/185.01, 185.07, 185.08, 185.24
   See application file for complete search history.

(56) References Cited

U.S. PATENT DOCUMENTS

| | | | |
|---|---|---|---|
| 5,914,895 A | | 6/1999 | Jenne |
| 5,986,932 A | * | 11/1999 | Ratnakumar et al. .. 365/185.07 |
| 6,122,191 A | * | 9/2000 | Hirose et al. .......... 365/185.01 |
| 6,172,907 B1 | * | 1/2001 | Jenne ..................... 365/185.18 |
| 6,363,011 B1 | | 3/2002 | Hirose et al. |
| 6,770,950 B1 | | 8/2004 | Yang et al. |
| 2005/0093054 A1 | * | 5/2005 | Jung .......................... 257/310 |
| 2005/0141266 A1 | * | 6/2005 | Jung ............................ 365/154 |
| 2005/0141267 A1 | * | 6/2005 | Kwon ......................... 365/154 |
| 2005/0141272 A1 | * | 6/2005 | Jung ..................... 365/185.08 |
| 2005/0142750 A1 | * | 6/2005 | Jung ......................... 438/257 |

* cited by examiner

*Primary Examiner*—Richard Elms
*Assistant Examiner*—Alexander Sofocleous
(74) *Attorney, Agent, or Firm*—Andrew D. Fortney

(57) ABSTRACT

Non-volatile memory elements having a high programming speed and a reduced constant voltage requirement for data storage. Each memory cell of a non-volatile SRAM includes an SRAM unit and a non-volatile memory unit. When power is off, the data levels of data nodes of the SRAM unit are programmed into a corresponding non-volatile memory element through a pass transistor connected to the data node. When the power is on, the data levels programmed into the non-volatile memory elements are recalled to the corresponding data nodes through the pass transistors, and then the programmed non-volatile memory element is erased. The non-volatile memory element has an oxide stack including a tunnel oxide film, a storage oxide film, and a blocking oxide film. A potential well where the SRAM unit is formed is isolated from a potential well where the non-volatile memory unit is formed. Bias voltages are applied during program, recall and erase modes to the potential well where the non-volatile memory unit is formed.

7 Claims, 5 Drawing Sheets

Erase mode : Vse=−10∼−15[V], Vrcl=0[V], Vpas=0[V]
Program mode : Vse=+10∼+15[V], Vrcl=0[V], Vpas=H
Recall mode : Vse=0[V], Vrcl=H, Vpas=H (BACKGROUND ART)

Erase mode : Vse=−Vers[V], Vb=+Vers/0[V], Vpas=0[V], Vcc=Floating
Program mode : Vse=+Vpgm[V], Vb=0[V], Vpas=H, Vcc=+Vcc_pgm[V]
Recall mode : Vse=+Vref[V], Vb=0[V], Vpas=H, Vcc=+Vcc_rcl[V]

US 7,110,293 B2

NON-VOLATILE MEMORY ELEMENT WITH OXIDE STACK AND NON-VOLATILE SRAM USING THE SAME

FIELD OF THE DISCLOSURE

The present disclosure relates generally to non-volatile static random access memory (nvSRAM) and, more particularly, to an nvSRAM using a non-volatile memory element having an oxide stack.

BACKGROUND

In recent years, non-volatile static random access memory has been widely used. Non-volatile static random access memory (nvSRAM) does not lose data stored therein, even when the power to the nvSRAM is interrupted.

A unit memory cell of an nvSRAM is described in U.S. Pat. No. 5,914,895. That unit memory cell includes a non-volatile circuit configured as a non-volatile memory element for maintaining non-volatile data. It also includes an SRAM configured as a volatile memory element for performing read and write operations of volatile data. FIG. 1 is a schematic equivalent circuit illustrating a unit memory cell 10 of the nvSRAM described in U.S. Pat. No. 5,914,895.

Referring to FIG. 1, the memory cell 10 includes an SRAM 12 and a pair of non-volatile memory circuits (hereinafter, referred to as NVM) 14. The SRAM 12 includes a pair of access transistors 30, 32 and a latch circuit 33. The latch circuit 33 includes two NMOS transistors and two PMOS transistors which are cross-coupled to each other.

A data true level signal and a data complement level signal are output to data nodes 20 and 22, respectively. The data nodes 20, 22 are located within the latch circuit 33. The data true level signal and the data complement level signal are opposite to each other.

The access transistor 30 is coupled between the data node 20 and a signal line BT. The access transistor 32 is coupled between the data node 22 and a signal line BC. The signal line BT is a bit line for the data true level. The signal line BC is a bit line for the data complement level. The bit lines BT and BC extend to all the stacked cells in a single vertical column in a memory cell array. Each vertical column of cells has a common pair of bit lines.

The access transistors 30, 32 are controlled by a signal applied to a signal line WL. The signal line WL is a word line connected in common to the gate terminals of the access transistors 30, 32 and to the gate terminals of all the other access transistors in all the stacked cells in a single low.

The NVM 14 is a circuit connected to each of the data nodes 20, 22 for storing data at the data nodes 20, 22 such that the stored data is not volatile.

The NVM 14 of FIG. 1 is configured as a pair of tri-gate transistors 41, 42 including recall transistors 41a and 42a, SONOS (silicon/oxide/nitride/oxide/silicon) transistors 41b and 42b, and pass transistors 41c and 42c.

The SONOS transistors 41b, 42b, which are described in U.S. Pat. No. 5,914,895 and U.S. Pat. No. 6,770,950, have an ONO (oxide/nitride/oxide) structure. The SONOS transistors 41b, 42b store the data levels of the data nodes 20, 22 such that the data levels stored in the latch circuit 33 are not volatile. The data levels stored in the SONOS transistors 41b, 42b are removed when a control signal Vse is applied thereto.

The recall transistors 41a, 42a recall the data levels stored in the SONOS transistors 41b, 42b and write the data levels stored in the SONOS transistors 41b, 42b into the latch circuit 33 when a control signal Vrcl is applied to the recall transistors 41a, 42a.

The pass transistors 41c, 42c read the state of the data true level signal and the complement level signal in the latch circuit 33, or write the data levels stored in the SONOS transistors 41b, 42b into the latch circuit 33 when a control signal Vpas is applied to the pass transistors 41c, 42c.

The operation of the conventional nvSRAM 10 will now be described. When a power source is on and the nvSRAM operates normally, all of the voltages of the control signals Vrcl, Vpas and Vse are set to 0[V] so that all of the transistors of the tri-gate transistors 41, 42 are turned off. As a result, the SONOS transistors 41b and 42b are isolated from the latch circuit 33 and, thus, are not affected by state variations of the levels at the data nodes 20, 22 of the latch circuit 33.

However, when the power source is turned off, the nvSRAM 10 stores the levels at the data nodes 20, 22 of the latch circuit 33 in the SONOS transistor 41b, 42b, or erases the levels while passing through an erase mode and a program mode.

In the erase mode, a voltage of −10 to −15 [V] (depending on erase speed, erase time, the ONO structure, etc) is applied to the gate electrodes of the SONOS transistors 41b, 42b. Also, a voltage of 0 [V] is applied to the control signal line Vrcl and to the control signal line Vpas for a predetermined time. In general, the bias voltage is usually applied for less than 10 [msec] in the erase mode.

Under the bias conditions of the erase mode, the recall transistors 41a, 42a and the pass transistors 41c, 42c are held in an off state, and the SONOS transistors 41b, 42b are placed in an accumulation mode. Most of the electric field associated with the voltage applied to the gate electrodes of the SONOS transistors 41b, 42b is concentrated on the ONO layer.

As a result of the intensive electric field concentrated on the ONO layer, holes accumulated on a silicon substrate surface on which the gate electrodes of the SONOS transistors 41b, 42b are placed tunnel through the tunnel oxide film of the SONOS transistors 41b, 42b, and are trapped in traps which are present in the nitride film of the SONOS transistors 41b, 42b. Then, the electrons which have been trapped in the nitride films tunnel the tunnel oxide and escape into the silicon substrate, thereby resulting in erasure whereby a threshold voltage of the SONOS transistors 41b, 42b is lowered.

Next, in the program mode, a voltage of +10 to +15 [V] (depending on program speed, program time, the ONO stack structure, etc) is applied to the gate electrodes of the SONOS transistors 41b, 42b. Also, 0 [V] is applied to the control signal line Vrcl, and a voltage "H" (herein, "H" refers to a voltage representing a high logic state; typically 2.5 [V]) is applied to the control signal line Vpas for a predetermined time. In general, the bias voltage is usually applied for less than 10 [msec] in the program mode.

Under the bias conditions of the program mode, the recall transistors 41a, 42a are held in an off state, and accordingly, do not conduct current from the Vcc voltage. The conducting states of the pass transistors 41c, 42c are determined by the logic levels ("H" and "L") stored in the data nodes 20, 22 of the latch circuit 33. For example, if we assume that a high voltage level "H" is stored in the data node 20 and a low voltage level "L" is stored in the data node 22, since a high level Vpas is applied to the gate electrode of the pass transistor 41c connected to the data node 20 and the data node 20 is connected to the source electrode of the pass transistor 41*c*, the voltage difference between the gate electrode and the source electrode becomes nearly 0 [V]. Accordingly, the pass transistor 41*c* does not conduct current. As a result, the silicon substrate below the gate electrode of the SONOS transistor 41*b* goes into a deep depletion state due to the positive voltage applied to the gate electrode of the SONOS transistor 41*b*.

During this deep depletion, since the electric field caused by the positive voltage Vse applied to the gate electrode of the SONOS transistor 41*b* is mostly applied to a depletion region of the silicon substrate and, thus, is only slightly applied to the ONO layer, the program mode (where electrons tunnel the tunnel oxide film and are trapped into the traps of the nitride film) does not occur. This phenomenon is called a dynamic write inhibition (DWI).

Since this deep depletion occurs in a non-equilibrium state, it disappears over time as the non-equilibrium state turns to an equilibrium state. When the deep depletion condition disappears, DWI does not occur any longer. In other words, although programming is not conducted due to the DWI phenomenon occurring at the beginning of the program mode, programming is conducted as the DWI phenomenon disappears after a predetermined period of time elapses. The characteristic of the DWI phenomenon depends on the device structure. The DWI phenomenon typically lasts for 1 to 100 [msec].

On the other hand, since the voltage Vpas applied to the gate electrode of the pass transistor 42*c* has a high level "H, a low voltage level "L" is stored in the data node 22, and since the data node 22 is connected to the source electrode of the pass transistor 42*c*, a voltage difference between the gate electrode and the source electrode becomes nearly "H" [V]. Consequently, the pass transistor 42*c* is turned on.

As a result, the voltage applied to the silicon substrate below the gate electrode of the SONOS transistor 42*b* becomes nearly an "L" [V]. Thus, most of the program voltage applied to the gate electrode of the SONOS transistor 42*b* is applied to the ONO layer. Accordingly, electrons accumulated on the surface of the silicon substrate tunnel the tunnel oxide film, and the program mode is conducted to trap the electrons in the traps of the nitride film. The trapped electrons increase the threshold voltage of the SONOS transistor 42*b*.

In other words, the SONOS transistor 41*b* maintains an erase state at the beginning of the program mode and, thus, has a low threshold voltage because the program mode is suppressed due to the DWI phenomenon. However, the SONOS transistor 42*b* has a high threshold voltage as the program mode is conducted.

When the power source is on, a recall mode for recalling data stored in the SONOS transistors 41*b*, 42*b* to the latch circuit 33 is performed. In the recall mode, a low voltage 0 [V] is applied to the control signal line Vse, and a high voltage "H" is applied to the control signal line Vrcl and to the control signal line Vpas.

Under the bias conditions of the recall mode, since the control signal line Vrcl and the control signal line Vpas are set to a logic high voltage "H", the recall transistors 41*a*, 42*a* and the pass transistors 41*c*, 42*c* go into an on state. Since the SONOS transistor 41*b* is in an on state, current flows therethrough and the data node 20 goes into a logic high state "H". Since the programmed SONOS transistor 42*b* is in an off state, it does not flow current therethrough and the data node 22 goes into a logic low state "L".

Accordingly, even though a memory element configured by the nvSRAM is powered off while passing through the erase mode, the program mode and the recall mode, the data of SRAM can be securely stored in the NVM 14.

However, in an nvSRAM using conventional SONOS transistors 41*b*, 42*b*, due to the DWI phenomenon when data is stored, one data node is programmed and the other data node is not programmed depending on the states of the data nodes 20, 22 of the latch circuit 33. In such a selective program mode, it is important to improve the DWI characteristic and the programming speed.

However, it is very difficult to improve the DWI characteristic. Although programming time is prolonged when the selective program mode is conducted by a DWI mechanism, a threshold voltage window (i.e., a difference between a threshold voltage of a SONOS transistor to be programmed and a threshold voltage of a SONOS transistor in which the DWI phenomenon occurs) cannot be increased beyond a certain voltage.

In addition, since the thickness of the tunnel oxide film of the SONOS transistor is very small (typically about 20 Å), the retention characteristic of the SONOS transistor is very poor. Furthermore, since the programming speed of the SONOS transistor is relatively low, a significantly large capacitance is required to maintain a constant voltage required to store the data of the SRAM for a predetermined time when the power is off.

BRIEF DESCRIPTION OF THE DRAWINGS

In the drawings and the following detailed description, the same or similar elements are denoted by the same reference.

DETAILED DESCRIPTION

Figure 2:
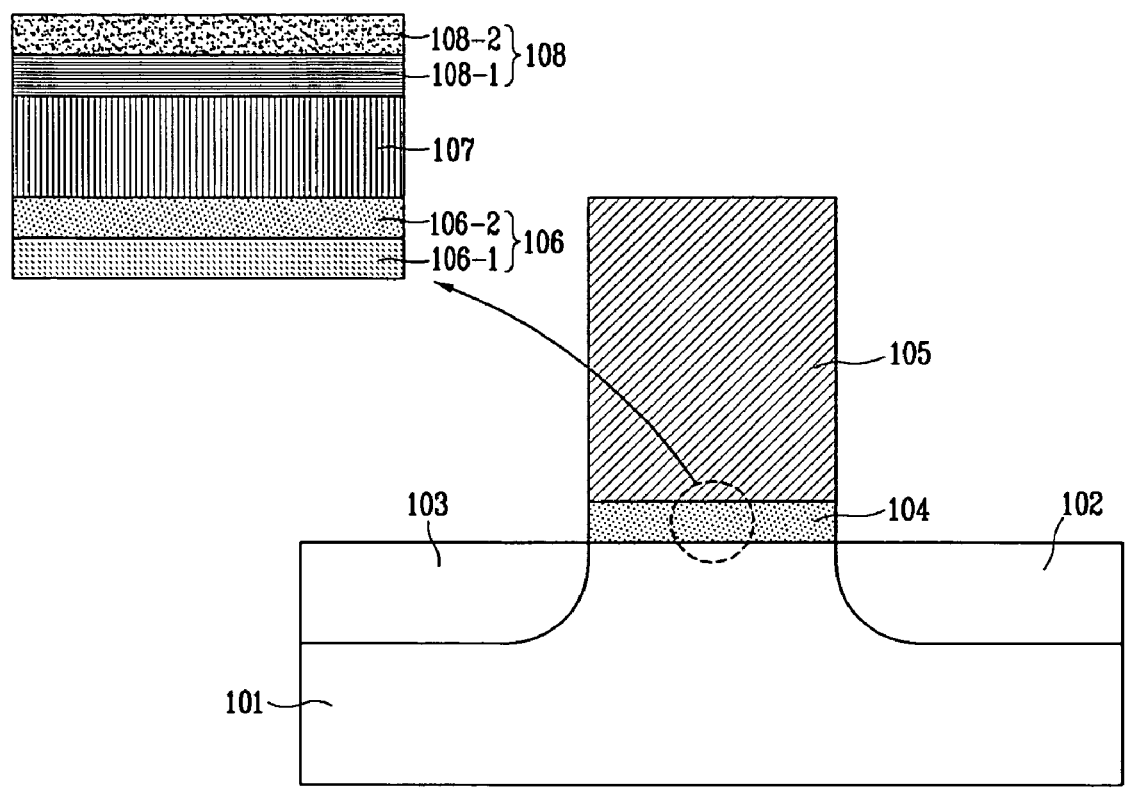
FIG. 2 is a cross-sectional view illustrating a structure of an example oxide stack non-volatile memory element 100 constructed in accordance with the teachings of the present invention.

FIG. 2 is a cross-sectional view illustrating the structure of an example oxide stack non-volatile memory element (hereinafter, referred to as an "OS transistor") 100 constructed in accordance with the teachings of the present invention. The illustrated OS transistor 100 includes a P type silicon substrate 101, a drain electrode 102, a source electrode 103, an oxide stack 104, and a polysilicon gate electrode 105. The oxide stack 104 and the polysilicon gate electrode 105 are sequentially deposited on the P type silicon 101, and the source electrode 103 and the drain electrode 102 are formed on opposite sides of the gate electrode 105.

In the illustrated example, the oxide stack 104 includes a tunnel oxide film 106, a storage oxide film 107, and a blocking oxide film 108.

The tunnel oxide film 106 can be configured as a single layer, or alternatively, as a double layer including a first tunnel oxide film 106-1 and a second tunnel oxide film 106-2. Similarly, the blocking oxide film 108 can be configured as a single layer, or alternatively, as a double layer including a first blocking oxide film 108-1 and a second blocking oxide film 108-2.

In the case of a single layered tunnel oxide film 106, the tunnel oxide film 106 is preferably made of $SiO_2$, $Al_2O_3$, or $Y_2O_3$.

In the case of a double layered tunnel oxide film 106, the first tunnel oxide film 106-1 is preferably made of $Al_2O_3$, $Y_2O_3$, $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, or $Lu_2O_3$, and the second tunnel oxide film 106-2 is preferably made of $SiO_2$, $Al_2O_3$, or $Y_2O_3$.

The storage oxide film 107 is preferably made of $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, or $Lu_2O_3$.

In the case of a single layered blocking oxide film 108, blocking oxide film 108 is preferably made of $SiO_2$, $Al_2O_3$, or $Y_2O_3$.

In the case of a double layered blocking oxide film 108, the first blocking oxide film 108-1 is preferably made of $SiO_2$, $Al_2O_3$, or $Y_2O_3$, and the second blocking oxide film 108-2 is preferably made of $Al_2O_3$, $Y_2O_3$, $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, or $Lu_2O_3$.

In a program mode, a threshold voltage rises as hot electrons are injected by hot electron injection over the potential barrier of the tunnel oxide film 106 and into a potential well formed in the storage oxide film 107.

In an erase mode, the threshold voltage drops as the electrons confined in the potential well of the storage oxide film 107 are tunneled into the silicon substrate by F/N (Fowler/Nordheim) tunneling.

In a recall mode, by detecting current flowing when a medium voltage (i.e., a voltage between the threshold voltage in the program state and the threshold voltage in the erase state) is applied to the gate electrode 105, it is determined whether the OS transistor 100 is in the program state or in the erase state.

Figure 1:
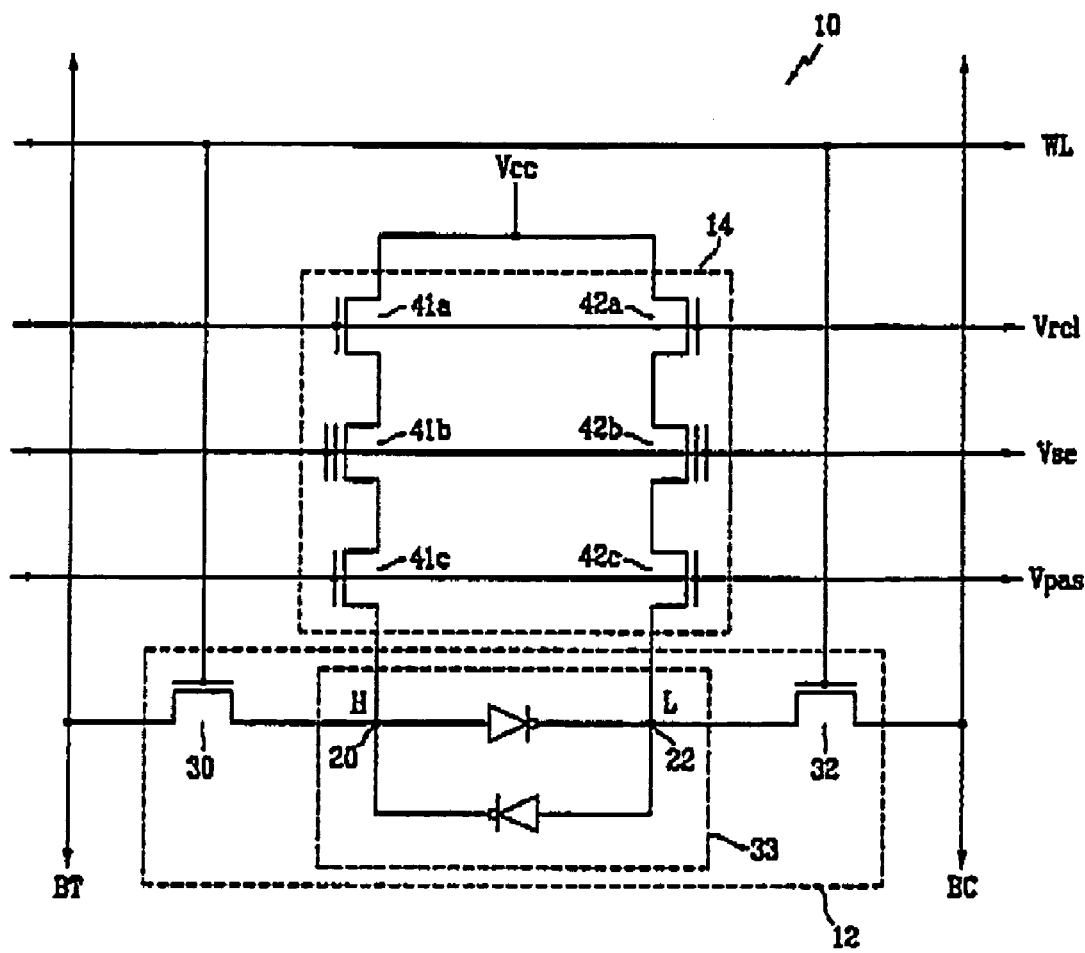
FIG. 1 is a schematic equivalent circuit diagram of a unit memory cell 10 of a conventional nvSRAM.
Figure 3:
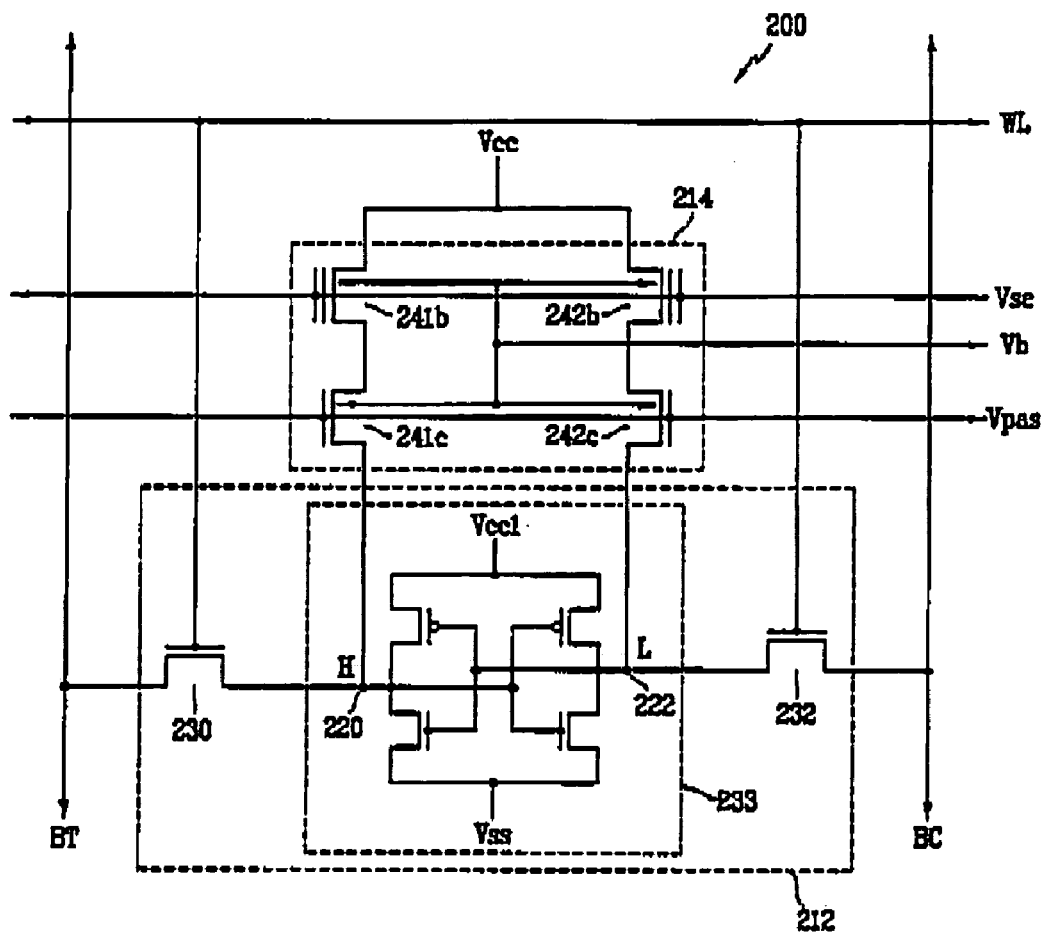
FIG. 3 is a schematic equivalent circuit diagram of an example unit cell of an nvSRAM employing an OS transistor 100.

FIG. 3 is a schematic equivalent circuit diagram of an example unit cell of an example nvSRAM employing the OS transistor 100 of FIG. 2. In the example of FIG. 3, the NVM 214 of the nvSRAM 200 is different from the NVM of the conventional nvSRAM of FIG. 1 in that it has a digate structure including the OS transistor and a pass transistor, but no recall transistor.

The example nvSRAM 200 of FIG. 3 includes a SRAM 212 and the NVM 214. The SRAM 212 includes a pair of access transistors 230, 232 and a latch circuit 233. The structure of the example SRAM 212 of FIG. 3 is the same as the structure of the conventional SRAM 12 of FIG. 1. Therefore, for the sake of brevity, a detailed explanation of that structure will not be repeated here. Instead, the interested reader is referred to the above description of the same.

As mentioned above, the example NVM 214 of FIG. 3 includes a pair of OS transistors 241b, 242b and a pair of pass transistors 241c, 242c. In addition, unlike the structure of the conventional nvSRAM 10 of FIG. 1, the example nvSRAM 200 of FIG. 3 has a structure where a separate bias voltage Vb is applied to a P-well in which the pair of pass transistors 241c, 242c and the pair of OS transistors 241b, 242b is disposed. The pass transistors 241c, 242c and the OS transistors 241b, 242b function as a digate. In view of the bias voltage Vb, the P-well in which the SRAM 212 is disposed must be isolated from the P-well in which the digate is disposed. These P-wells are separately formed and are isolated from each other such that the separate bias voltage Vb is applied to the P-well in which the digate is located, whereas the P-well in which the SRAM 212 is located catches a well-pick up. A sectional stack for such a structure will be later described in detail with reference to FIG. 5.

Operation of the example nvSRAM 200 of FIG. 3 will now be described. When the nvSRAM 200 is powered off and then powered back on, it loads data stored in the OS transistors 241b, 242b into the latch circuit 233 and simultaneously erases all the data stored in the OS transistors 241b, 242b while passing through the recall mode and the erase mode.

Operation of the recall mode will now be described. It is assumed that the OS transistor 241b is in an erase state, and the OS transistor 242b is in a program state. A medium voltage Vref which is less than a threshold voltage of the programmed OS transistor 242b and greater than a threshold voltage of the erased OS transistor 241b is applied to a control signal line Vse. 0 [V] is applied to a bias signal line Vb. A logic high voltage "H" is applied to a control signal line Vpas. An operation voltage supply line Vcc is biased by a voltage of +Vcc_rcl. In particular, since the program mode may be conducted in the recall mode if the voltage of +Vcc_rcl applied to the operation voltage supply line Vcc is very high, an appropriate voltage at which the program mode is not conducted must be set for the recall mode.

The pass transistors 241c, 242c enter a conducting state since the H level voltage Vpas is applied to their gate electrodes. The erased OS transistor 241b enters a conducting state. Accordingly, a data node 220 of the latch circuit 233 enters a logic high state "H" as current flows from Vcc to the data node 220. In addition, since the programmed OS transistor 242b is in a non-conducting state, the data node 222 of the latch circuit 233 enters a logic low state "L" since current does not flow to the data node 222. In short, in the recall mode, the data stored in the OS transistors 241b, 242b is respectively recalled (i.e., written) to the data nodes 220, 222 of the latch circuit 233.

The erase mode conducted after the recall mode is completed will now be described. The bias voltages are set as follows in the erase mode: Vse=−Vers [V], Vb=+Vers/0 [V], Vpas=0 [V], and Vcc=floating. When these bias voltages are applied for a predetermined time, the pass transistors 241c, 242c enter the off state. Further, the OS transistors 241b, 242b enter an accumulation state. Accordingly, the voltage applied to Vse and Vb is mostly applied to the oxide stack between the gate electrodes of the OS transistors 241b, 242b and the silicon substrate. Due to the strong electric field caused by the voltage applied to the oxide stack, electrons confined in a potential well of the oxide stack are tunneled into the silicon substrate, thereby decreasing the threshold voltage of the OS transistors 241b, 242b.

Conventional non-volatile memory elements use tunneling oxide films having a thickness of about 100 Å to obtain a good retention characteristic. As a result, the erase mode conducted by tunneling the electrons has a very low speed of about 100 [msec]. Accordingly, the erase mode cannot be conducted with these conventional devices at a point of time when the power is off.

However, in the case of the example nvSRAM of FIG. 3 using the OS transistor 100, when the power is on, both of the OS transistors 241b, 242b connected to the latch circuit 233 are certainly erased through the erase mode after the recall mode is completed.

Next, the program mode will be described. More specifically, the program mode for storing data in the OS transistors 241b, 242b when the data nodes 220, 222 of the latch circuit 233 are in a logic high state "H" and a logic low state "L", respectively, will now be described.

In the program mode, a voltage +Vpgm [V] is applied to Vse, 0 [V] is applied to Vb, a logic high voltage H is applied to Vpas, and a voltage +Vcc_pgm [V] is applied to Vcc. Under such biasing conditions, the two erased OS transistors 241b, 242b enter an on state due to the voltage applied to Vse. A source electrode of the pass transistor 241c is connected to the data node 220 which has a logic high level H. Vpas, which is set to a logic high level H, is applied to a gate electrode of the pass transistor 241c. Accordingly, current does not flow through the pass transistor 241c since the voltage difference Vgs between the source electrode and the gate electrode of the pass transistor 241c becomes 0 [V]. Consequently, the OS transistor 241b is not programmed and maintains an erase state.

On the other hand, since the data node 22 is in a logic low state "L", current flows through the pass transistor 242c since the voltage difference Vgs between the source electrode and the gate electrode of the pass transistor 242c becomes "H". Accordingly, electrons forming a channel are accelerated by a Vcc drain voltage and are injected into the OS transistor 242b by a hot electron injection method, thereby increasing the threshold voltage of the OS transistor 242b. As a result, programming of the OS transistor 242b by hot electron injection is very fast (e.g., less than about 100 [psec]). In addition, in the program mode, a constant voltage +Vpgm [V] can continue to be applied to Vse for a predetermined time (i.e., constant voltage program), or the OS transistors can be programmed while increasing the voltage of Vse at a constant rate (i.e., step voltage program).

Figure 4:
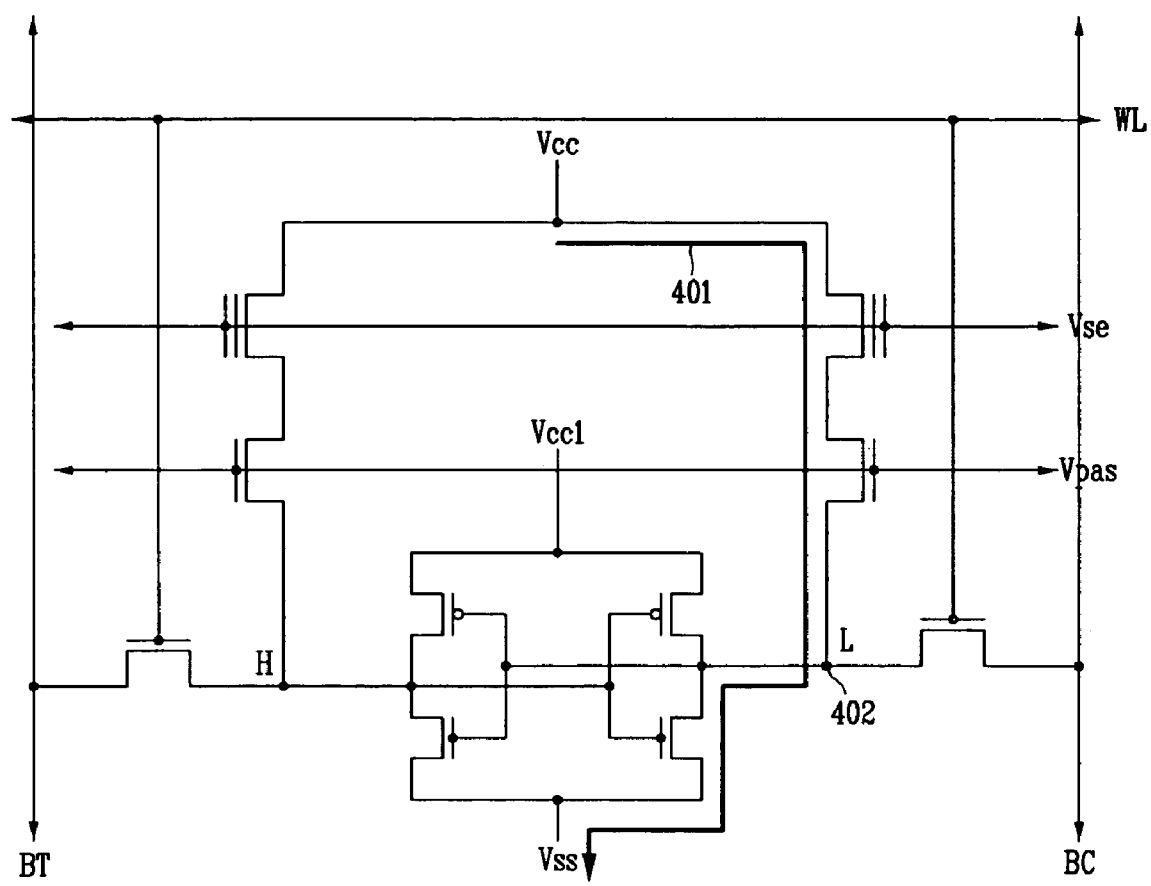
FIG. 4 is a circuit diagram illustrating an example static current path which can be generated in a program mode of an example nvSRAM constructed in accordance with the teachings of the present invention.

FIG. 4 is a diagram showing a static current path which can be generated in a program mode of the example nvSRAM of FIG. 3. Assuming that the data node 222 of the latch circuit 233 is in a logic low state "L", a static current path 401 can be generated. The potential of a node 402 can be varied by this static current path 401. If the potential of the node 402 becomes high enough to turn on an opposite NMOS, an error may occur such that the data node 222 (see FIG. 3) is suddenly changed from a logic low state "L" to a logic high state "H".

In order to minimize the variation of the potential of the node 402 due to the static current path 401 in the program mode, the potential of the node 402 is suppressed so that is does not rise beyond a constant value. This suppression is accomplished by increasing the threshold voltage of the pass transistors 241c, 242c, since the potential of the node 402 cannot rise beyond a value derived by subtracting the threshold voltage of the pass transistors 241c, 242c from the voltage Vcc, i.e., a value of (Vcc−Vt_pass).

In order to increase the threshold voltage of the pass transistors 241c, 242c, the gate oxide films of the pass transistors 241c, 242c can be formed to be thicker than those of typical transistors.

Figure 5:
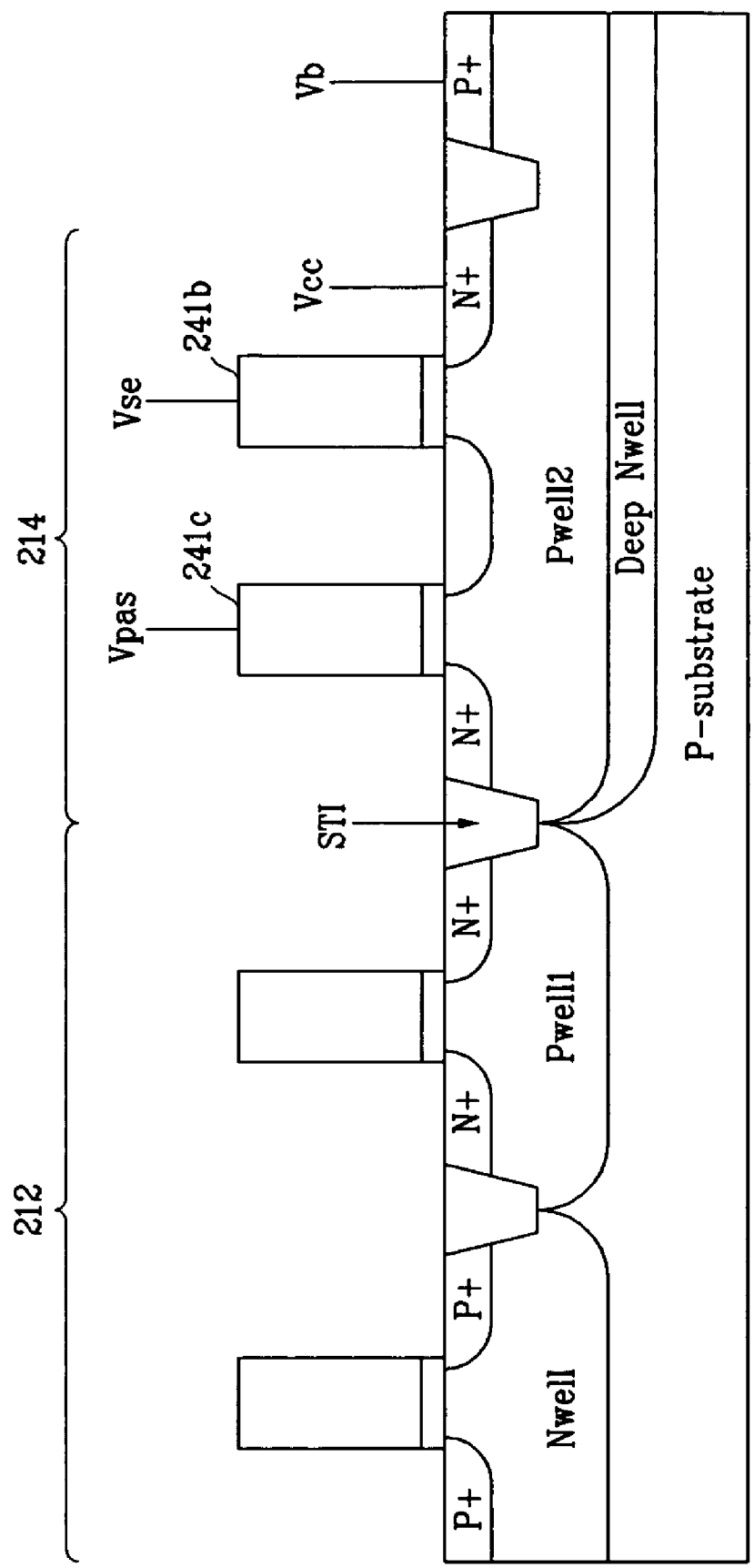
FIG. 5 is a cross-sectional view illustrating an example nvSRAM using an OS transistor.

FIG. 5 is a cross-sectional view illustrating a cross-sectional structure of the example nvSRAM using the OS transistor. In the example of FIG. 5, a PMOS transistor and an NMOS transistor for the SRAM 212 are formed in an N well and a P well1, respectively. The OS transistors 241b, 242b of the NVM 214 are formed in a P well2, which is separated from the P well1 for the SRAM by a deep N well.

Vpas and Vse are respectively applied to the gate electrodes of the pass transistor 241c and the OS transistor 241b composing the digate. Vcc is applied to a right drain electrode of the OS transistor 241b. Vb is applied to the P well2.

Since the illustrated example nvSRAM using the OS transistors has a very high programming speed, a capacitance for maintaining a constant voltage for a constant time can be reduced below $\frac{1}{100}$ when the power is off, and a threshold voltage difference between an erased OS transistor and a programmed OS transistor can be increased above 5 [V].

In addition, since the tunnel oxide film is thick, the illustrated example nvSRAM using the OS transistors has a retention characteristic far superior to the nvSRAM using the SONOS transistors described above. Furthermore, the program mode of the nvSRAM of FIGS. 3 and 5 is not affected by a DWI phenomenon since the program characteristic has no relation with a DWI characteristic.

In addition, in the program mode of the nvSRAM of FIGS. 3 and 5, since current does not flow through the OS transistor 241b, 242b connected to the data node 220, 222 of the latch circuit 233 in the "H" state, the threshold voltage of the OS transistor 241b, 242b connected to the data node 220, 222 of the SRAM in the "H" state is not increased, even when the program time is prolonged.

As is apparent from the above description, the illustrated nvSRAM using the OS transistors has advantages over the conventional nvSRAM using conventional SONOS transistors described above. For example, since the illustrated nvSRAM using the OS transistors has a very high programming speed, the capacitance needed to maintain a constant voltage for a constant time can be reduced below $\frac{1}{100}$. Further, since the program mode is conducted by hot electron injection, it has a high efficiency of electron injection and there is a very high probability that injected electrons will be captured in the potential well of the oxide stack NVM. Accordingly, the threshold voltage difference between an erased OS transistor and a programmed OS transistor can be greatly increased above 5 [V]. Third, since the tunnel oxide film is thick, the example nvSRAM using OS transistors as described above has a far superior retention characteristic than an nvSRAM using SONOS transistors.

Fourth, while the prior art nvSRAM using the SONOS transistors described above is disadvantageous in that programming continues to be conducted as the program time is prolonged which results in an increase of the threshold voltage, in the example nvSRAM using OS transistors described above, the threshold voltage of the OS transistor connected to a data node of the SRAM in the logic high state "H" is not increased even when program time is prolonged since current does not flow through the OS transistor due to the pass transistor.

Fifthly, while the program characteristic of the prior art nvSRAM using the SONOS transistors is affected by a DWI phenomenon, the program characteristic of the above-described example nvSRAM using the OS transistors is not affected by the DWI phenomenon.

From the foregoing, persons of ordinary skill in the art will appreciate that non-volatile memory elements have been disclosed which have a high programming speed and an improved DWI characteristic. Such persons will further appreciate that that non-volatile memory elements have been disclosed which have a high programming speed and which require a reduced constant voltage for data storage.

A disclosed example non-volatile SRAM includes a plurality of unit memory cells arranged in an array form. Each of the plurality of unit memory cells comprises: an SRAM unit including first and second transistors which are cross-coupled to each other, a data true node to which a control electrode of the first transistor and a drain electrode of the second transistor are connected, and a data complement node to which a control electrode of the second transistor and a drain electrode of the first transistor are connected. Each memory unit cell also includes a non-volatile memory unit including first and second pass transistors connected to the data true node and to the data complement node, respectively. The first and second pass transistors are switched in response to a supply of power to the SRAM unit. The non-volatile memory unit also includes first and second non-volatile memory elements connected to the first and second pass transistors, respectively, to store the data of the data true node and the data of the complement node, respectively, in response to a supply of power to the SRAM unit. A first well in which the non-volatile memory unit is formed is electrically isolated from a second well in which the SRAM unit is formed.

Preferably, the first well is surrounded by a third well with a conductivity type different from that of the first well.

Preferably, the first well in which the non-volatile memory unit is formed is connected to a control line for application of a bias voltage.

Preferably, the first and second non-volatile memory elements are transistors having an oxide stack including a tunnel oxide film formed in a region between a source region and a drain region; a storage oxide film formed on the tunnel oxide film; a blocking oxide film formed on the storage oxide film; and a gate electrode formed on the blocking oxide film.

Preferably, the threshold voltages of the first and second pass transistors are higher than a threshold voltage of the first transistor.

Further, a disclosed example non-volatile storage device for storing data stored in a memory cell as non-volatile data, includes: a pass transistor connected to a data node of the memory cell and operated in response to a first control signal such that data of the data node is programmed or recalled. It also includes a non-volatile memory element connected to the pass transistor and operated in response to a second control signal such that data of the data node is programmed. A well in which the pass transistor and the non-volatile memory element are formed is connected to a third control line for application of a bias voltage.

Preferably, the non-volatile memory element includes a tunnel oxide film formed in a region between a source region and a drain region; a storage oxide film formed on the tunnel oxide film; a blocking oxide film formed on the storage oxide film; and a gate electrode formed on the blocking oxide film.

Preferably, the pass transistor has a threshold voltage for blocking static current flowing through the non-volatile memory element to be programmed.

A disclosed example method for driving the above-described non-volatile storage device comprises: a) erasing the non-volatile memory element by applying an off signal as a first control signal and an erase signal as a second control signal to the non-volatile memory element; b) programming the data into the non-volatile memory element through the pass transistor by applying an on signal as the first control signal and a program signal as the second control signal to the non-volatile memory element; and c) recalling the data programmed into the non-volatile memory element through the pass transistor by applying the on signal as the first control signal and a recall signal as the second control signal to the non-volatile memory element.

Preferably, when recalling the data programmed into the non-volatile memory element, a bias voltage for erasing electrons trapped in the non-volatile memory element is applied to the third control line.

Preferably, the recall signal as the second control signal has a medium voltage between a threshold voltage of the non-volatile memory element in a programmed state and a threshold voltage of the non-volatile memory element in an erased state.

It is noted that this patent claims priority from Korean Patent Application Serial Number 10-2003-97916, which was filed on Dec. 26, 2003, and is hereby incorporated herein by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A non-volatile SRAM including a plurality of unit memory cells arranged in an array, wherein each of the plurality of unit memory cells comprises:
   an SRAM unit including first and second transistors which are cross-coupled to each other, a data true node to which a control electrode of the first transistor and a drain electrode of the second transistor are connected, and a data complement node to which a control electrode of the second transistor and a drain electrode of the first transistor are connected; and
   a non-volatile memory unit including: (a) first and second pass transistors
   connected to the data true node and the data complement nod; respectively, the first and second
   pass transistors being switched in response to supply of power to the SRAM unit and having threshold voltages higher than a threshold voltage of the first transistor, and (b) first and second non-volatile memory elements connected to the first and second pass transistors, respectively, to store data from the data true node and data from the data complement node, respectively, in response to supply of power to the SRAM unit, wherein a first well in which the non-volatile memory unit is formed is electrically isolated from a second well in which the SRAM unit is formed.

2. A non-volatile SRAM as defined in claim 1, wherein the first well is surrounded by a third well, the third well having a first conductivity type and the first well having a second conductivity type, the first conductivity type being different from the second conductivity type.

3. A non-volatile SRAM as defined in claim 1, wherein the first well in which the non-volatile memory unit is formed is connected to a control line for application of a bias voltage.

4. A non-volatile SRAM as defined in claim 1, wherein each of the first and second non-volatile memory elements comprises a transistor having an oxide stack including:
   a tunnel oxide film located in a region between a source region and a drain region;
   a storage oxide film located on the tunnel oxide film;
   a blocking oxide film located on the storage oxide film; and
   a gate electrode located an the blocking oxide film.

5. A non-volatile storage device to store data stored in a memory cell as non-volatile data, comprising:
   a pass transistor connected to a data node of the memory cell and responsive to a first control signal such that data of the data node is programmed or recalled, wherein the pass transistor has a threshold voltage to block static current flowing through a non-volatile memory element connected thereto: and the non-volatile memory element, responsive to a second control signal such that data of the data node is programmed, wherein a well in which the pass transistor and the non-volatile memory element are located is connected to a control line to apply a bias voltage to the well, and the non-volatile memory element comprises:
 a tunnel oxide film located in a region between a source region and a drain region:
 a storage oxide film located on the tunnel oxide film;
 a blocking oxide film located on the storage oxide film; and
 a gate electrode located on the blocking oxide film.

6. A method to drive a non-volatile storage device comprising:
 a) erasing a non-volatile memory element by applying an off signal as a first control signal and an erase signal as a second control signal to the non-volatile memory element;
 b) programming data into the non-volatile memory element through a pass transistor by applying an on signal as the first control signal and a program signal as the second control signal to the non-volatile memory element; and
 c) recalling the data programmed into the non-volatile memory element through the pass transistor by applying the on signal as the first control signal and a recall signal as the second control signal to the non-volatile memory element wherein the recall signal has a voltage less than a threshold voltage of the non-volatile memory element when in a programmed state and greater than a threshold voltage of the non-volatile memory element when in an erased state.

7. A method as defined in claim 6, wherein a bias voltage to erase electrons trapped in the non-volatile memory element is applied to a well in which the pass transistor and the non-volatile memory element are located when recalling the data programmed into the non-volatile memory element.

* * * * *